US009142636B2

(12) United States Patent
Sheppard et al.

(10) Patent No.: US 9,142,636 B2
(45) Date of Patent: Sep. 22, 2015

(54) METHODS OF FABRICATING NITRIDE-BASED TRANSISTORS WITH AN ETCH STOP LAYER

(71) Applicant: Cree, Inc., Durham, NC (US)

(72) Inventors: Scott T. Sheppard, Chapel Hill, NC (US); Andrew K. Mackenzie, Cary, NC (US); Scott T. Allen, Apex, NC (US); Richard P. Smith, San Jose, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/892,530

(22) Filed: May 13, 2013

(65) Prior Publication Data

US 2013/0252386 A1    Sep. 26, 2013

Related U.S. Application Data

(62) Division of application No. 11/185,398, filed on Jul. 20, 2005, now abandoned.

(51) Int. Cl.

| | | |
|---|---|---|
| *H01L 29/778* | (2006.01) | |
| *H01L 29/66* | (2006.01) | |
| *H01L 29/80* | (2006.01) | |
| *H01L 29/43* | (2006.01) | |

(Continued)

(52) U.S. Cl.

CPC .... *H01L 29/66431* (2013.01); *H01L 29/42316* (2013.01); *H01L 29/432* (2013.01); *H01L 29/66462* (2013.01); *H01L 29/778* (2013.01); *H01L 29/7787* (2013.01); *H01L 29/802* (2013.01); *H01L 29/2003* (2013.01); *H01L 2924/13064* (2013.01)

(58) Field of Classification Search

CPC ............ H01L 29/432; H01L 29/66431; H01L 29/66462; H01L 29/778; H01L 29/7787; H01L 29/802; H01L 2924/13064
USPC .......................... 257/200, E31.019; 438/172
See application file for complete search history.

(56) References Cited

U.S. PATENT DOCUMENTS

| | | | |
|---|---|---|---|
| 4,946,547 A | 8/1990 | Palmour et al. | |
| 5,192,987 A | 3/1993 | Khan et al. | |

(Continued)

FOREIGN PATENT DOCUMENTS

| | | |
|---|---|---|
| JP | 59-127871 A | 7/1984 |
| JP | 4-092439 A | 3/1992 |

(Continued)

OTHER PUBLICATIONS

English machine translation of JP2002-093819A of record.*

(Continued)

*Primary Examiner* — Tom Thomas
*Assistant Examiner* — Christopher M Roland
(74) *Attorney, Agent, or Firm* — Myers Bigel Sibley & Sajovec, P.A.

(57) ABSTRACT

A III-Nitride field-effect transistor, specifically a HEMT, comprises a channel layer, a barrier layer on the channel layer, an etch stop layer on the cap layer, a dielectric layer on the etch stop layer, a gate recess that extends to the barrier layer, and a gate contact in the gate recess. The etch stop layer may reduce damage associated with forming the recessed gate by not exposing the barrier layer to dry etching. The etch stop layer in the recess is removed and the remaining etch stop layer serves as a passivation layer.

7 Claims, 3 Drawing Sheets

(51) Int. Cl.
*H01L 29/423* (2006.01)
*H01L 29/20* (2006.01)

(56) References Cited

U.S. PATENT DOCUMENTS

| | | | |
|---|---|---|---|
| 5,200,022 | A | 4/1993 | Kong et al. |
| 5,210,051 | A | 5/1993 | Carter, Jr. |
| 5,260,599 | A | 11/1993 | Ponse et al. |
| 5,270,554 | A | 12/1993 | Palmour |
| 5,292,501 | A | 3/1994 | Degenhardt et al. |
| 5,296,395 | A | 3/1994 | Khan et al. |
| RE34,861 | E | 2/1995 | Davis et al. |
| 5,389,574 | A | 2/1995 | Mizunuma |
| 5,393,993 | A | 2/1995 | Edmond et al. |
| 5,484,740 | A * | 1/1996 | Cho ................. 438/167 |
| 5,523,589 | A | 6/1996 | Edmond et al. |
| 6,087,256 | A | 7/2000 | Wada |
| 6,218,680 | B1 | 4/2001 | Carter, Jr. et al. |
| 6,316,793 | B1 | 11/2001 | Sheppard et al. |
| 6,686,616 | B1 | 2/2004 | Allen et al. |
| 6,867,078 | B1 | 3/2005 | Green et al. |
| 7,238,560 | B2 | 7/2007 | Sheppard et al. |
| 7,465,967 | B2 | 12/2008 | Smith et al. |
| 2001/0032999 | A1 | 10/2001 | Yoshida |
| 2001/0040246 | A1 | 11/2001 | Ishii |
| 2002/0066908 | A1 | 6/2002 | Smith |
| 2002/0167023 | A1 | 11/2002 | Chavarkar et al. |
| 2003/0006437 | A1 | 1/2003 | Mizuta et al. |
| 2003/0020092 | A1 | 1/2003 | Parikh et al. |
| 2003/0102482 | A1 | 6/2003 | Saxler |
| 2004/0061129 | A1 | 4/2004 | Saxler et al. |
| 2005/0051796 | A1 | 3/2005 | Parikh et al. |
| 2005/0145883 | A1 | 7/2005 | Beach et al. |
| 2005/0170574 | A1 | 8/2005 | Sheppard et al. |
| 2006/0102929 | A1 | 5/2006 | Okamoto et al. |
| 2006/0202272 | A1 | 9/2006 | Wu et al. |

FOREIGN PATENT DOCUMENTS

| | | |
|---|---|---|
| JP | 7-211730 A | 8/1995 |
| JP | 2001-217258 A | 8/2001 |
| JP | 2002-093819 A | 3/2002 |
| JP | 2002-359256 A | 12/2002 |
| JP | 2004-214471 A | 7/2004 |
| JP | 2005-86171 A | 3/2005 |
| JP | 2005-136002 A | 5/2005 |
| WO | WO 03/071607 A1 | 8/2003 |
| WO | WO 2004/061978 A1 | 7/2004 |
| WO | WO 2005/029589 A1 | 3/2005 |
| WO | WO 2005/057624 A2 | 6/2005 |
| WO | WO 2005/059983 A1 | 6/2005 |

OTHER PUBLICATIONS

European Search Report Corresponding to European Application No. 12164835.6; Dated: Sep. 11, 2012; 5 Pages.

International Search Report, PCT/US2006/026952, Jan. 25, 2007.

Jang et al., "High Quality Nonalloyed Pt Ohmic Contacts to P-Tyoe GaN Using Various Surface Treatment," Extended Abstracts of the 1999 International Conference on Solid State Devices and Materials, Tokyo, 1999, pp. 218-219.

Japanese Office Action Corresponding to Japanese Application No. 2008-522820; Mailing Date: Jan. 20, 2012; 7 pages.

Japanese Office Action Corresponding to Japanese Patent Application No. 2008-522820; Mailing Date: Jun. 1, 2012; Foreign Text, 5 Pages, English Translation Thereof, 6 Pages.

Japanese Office Action Corresponding to Japanese Patent Application No. 2008-522820; Mailing Date: Oct. 12, 2012; Foreign Text, 3 Pages, English Translation Thereof, 6 Pages..

Japanese Office Action Corresponding to Japanese Patent Application No. 2008-522820; Mailing Date: Mar. 15, 2013; Foreign Text, 2 Pages, English Translation Thereof, 2 Pages.

Ren et al., "Reduction of sidewall roughness during dry etching of SiO2," J. Vac. Sci. Technol. B10(6), Nov./Dec. 1992, pp. 2407-2411.

Shen et al., "High-Power Polarization-Engineered GaN/AlGaN/GaN HEMTs Without Surface Passivation", *IEEE Electron Device Letters*, vol. 25, No. 1, Jan. 2004, pp. 7-9.

Yu et al., "Schottky Barrier Engineering in III-V Nitrides Via the Piezoelectric Effects", *Applied Physics Letters*, vol. 73, No. 13, Sep. 28, 1998, pp. 1880-1882.

Office Action, Japanese Patent Application No. 2013-147350, Sep. 2, 2014, 3 pp.

Decision of Rejection with English language translation, Japanese Patent Application No. 2013-147350, Apr. 30, 2015, 8 pp.

* cited by examiner

METHODS OF FABRICATING NITRIDE-BASED TRANSISTORS WITH AN ETCH STOP LAYER

CROSS-REFERENCE TO RELATED APPLICATION

The present application is a divisional of U.S. patent application Ser. No. 11/185,398, filed Jul. 20, 2005, entitled Nitride-Based Transistors With an Etch Stop Layer, the disclosure of which is hereby incorporated herein by reference as if set forth fully herein.

FIELD OF THE INVENTION

The present invention relates to semiconductor devices and in particular relates to transistors, such as high electron mobility transistors (HEMT), that incorporate nitride-based active layers and a recessed gate structure, and methods of fabricating same.

BACKGROUND

Materials such as silicon (Si) and gallium arsenide (GaAs) have found wide application in semiconductor devices for lower power and (in the case of Si) lower frequency applications. These, more familiar, semiconductor materials may not be well suited for higher power and/or high frequency applications, however, because of their relatively small bandgaps (e.g., 1.12 eV for Si and 1.42 for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and silicon.

An example of a device developed for high frequency applications is the metal-semiconductor field effect transistor (MESFET). A MESFET is formed on a high-resistivity or semi-insulating substrate by placing an epitaxial layer of conductive p or n-doped material on the substrate. Source, gate, and drain contacts are then made to the epitaxial layer, and when a potential (voltage) is applied to the gate, it creates a depletion region that pinches off the channel between the source and drain thereby turning the device off.

Another device of particular interest for high power and/or high frequency applications is the High Electron Mobility Transistor (HEMT), which, in certain cases, is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, $10^{13}$ carriers/cm$^2$. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over MESFETs for high-frequency applications.

High electron mobility transistors fabricated in the gallium nitride/aluminum gallium nitride (GaN/AlGaN) material system can generate large amounts of RF power because of the combination of material characteristics that includes the aforementioned high breakdown fields, their wide bandgaps, large conduction band offset, and/or high saturated electron drift velocity. A major portion of the electrons in the 2DEG is attributed to polarization in the AlGaN.

HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

One step in the fabrication of some nitride-based transistors is the formation of a gate contact in a recess. A thick cap structure of the transistor may be desirable in achieving high current capability and low dispersion. However, a gate recess through the cap layer may be desirable to achieve high breakdown voltage, low RF dispersion and/or high transconductance with concomitant high-frequency performance. On the other hand, an etching process used to form a recessed gate structure may damage the underlying barrier layer(s). Damage to the barrier layer may result in the formation of a high density of surface states or traps that adversely affect device operation. United States Patent Publication No. 2005/0170574 A1, published Aug. 4, 2005, and entitled "NITRIDE-BASED TRANSISTORS WITH A PROTECTIVE LAYER AND A LOW-DAMAGE RECESS AND METHODS OF FABRICATION THEREOF", the disclosure of which is incorporated herein as if set forth fully herein, describes techniques to provide a low-damage recess through SiN passivation and resulting devices. U.S. patent application Ser. No. 10/897,726, filed Jul. 23, 2004 and entitled "METHODS OF FABRICATING NITRIDE-BASED TRANSISTORS WITH A CAP LAYER AND A RECESSED GATE", the disclosure of which is incorporated herein as if set forth fully herein, describes techniques to provide a low-damage recess through the annealing of the recessed gate prior to formation of the gate contact and resulting devices.

SUMMARY OF THE INVENTION

Some embodiments of the present invention provide III-nitride based transistors and methods of making the same that utilize an etch stop layer to protect underlying layers from etch damage associated with the formation of recesses. In some embodiments, the recess may be used for a recessed gate contact.

In some embodiments, a III-nitride based transistor comprises a silicon carbide substrate, one or more nitride-based surface layers, an etch stop layer and a gate contact formed in a recess. Some embodiments provide methods of fabricating the gate contact recess that comprise etching the recess to the etch stop layer and subsequently removing a part of the etch stop layer in the recess to expose the portion of the surface layer intended for the gate contact. The III-nitride based transistor may be a MESFET, HEMT, JFET, MOSFET, IGBT, MISHFET or any other transistor with a recessed gate contact.

In some embodiments of the present invention, a high electron mobility transistor (HEMT) comprises a nitride-based channel layer, a nitride-based barrier layer on the channel layer, an etch stop layer on the channel layer, a dielectric layer on the etch stop layer, and a gate contact recess in the dielectric and etch stop layers that extends to the barrier layer. In other embodiments of the present invention, the transistor comprises a nitride-based channel layer, a nitride-based barrier layer on the channel layer, a cap layer on the barrier layer, and a dielectric layer on the cap layer. The gate contact recess may extend through the dielectric layer and cap layer to the barrier layer. In other embodiments, the gate contact recess extends through the dielectric layer and partially into the cap layer, but not to the barrier layer. In still other embodiments, a cap layer, an etch stop layer and a dielectric layer are all present.

Some embodiments of the present invention provide methods of fabricating HEMTs, including forming a nitride-based channel layer on a substrate, forming a nitride-based barrier layer on the channel layer, forming an etch stop layer on the channel layer, forming a dielectric layer on the etch stop layer and forming a gate recess in the dielectric and etch stop layers that extends to the barrier layer. The gate contact, which may be a Schottky contact, is formed in the gate recess.

In additional embodiments of the present invention, the method further includes forming ohmic contacts to the barrier layer of the device on opposite sides of the gate recess. In some embodiments, the ohmic contacts are formed on the surface or partially into the barrier layer prior to the formation of the etch stop layer, dielectric layer and/or the gate contact recess. In other embodiments, the ohmic contacts are formed after the formation of the etch stop layer, dielectric layer, and gate contact recess. Ohmic contact recesses are then provided through the dielectric layer and etch stop layer to expose portions of the barrier layer.

In still further embodiments of the present invention, forming a gate recess includes patterning a mask layer on the dielectric layer to have an opening corresponding to the gate recess and etching the dielectric layer to the etch stop using the patterned mask layer as an etch mask. The etch stop layer may reduce damage in the gate recess by isolating and protecting the surface of the barrier layer during the dielectric layer etch. Forming the gate recess further includes removing the etch stop layer in the gate recess thereby extending the gate recess to the barrier layer.

In some embodiments of the present invention, another insulating layer is formed on the dielectric layer and in the gate recess. The insulating layer may be the same material as the dielectric layer. The gate contact may be formed on the insulating layer in the gate recess. The gate contact may also extend onto the insulating layer on the dielectric layer.

In additional embodiments of the present invention, the methods further include forming a cap layer. The cap layer is formed on the barrier layer before forming the dielectric layer. Gate recess formation then comprises etching the dielectric layer to the cap layer and then removing the some or all the remaining cap layer in the gate recess. In some embodiments of the present invention, forming a cap layer includes forming a GaN layer on the barrier layer. For example, the GaN layer may be an undoped GaN layer, an AlGaN layer graded to GaN, an AlGaN layer graded to GaN and a doped GaN layer and/or a doped GaN layer. Forming a cap layer may also include forming a GaN layer on the barrier layer and forming a SiN layer on the GaN layer. Furthermore, forming a gate recess may include forming a gate recess that extends through the cap layer and into but not through the barrier layer. In particular embodiments of the present invention, the cap layer includes a GaN based semiconductor material. In still other embodiments, the cap layer, the etch stop layer and the dielectric layer are all sequentially formed on the barrier layer.

In additional embodiments of the present invention, methods of fabricating high electron mobility transistors include forming a first layer of GaN based semiconductor material on a substrate and forming a second layer of AlGaN based semiconductor material on the first layer, the second layer being configured to induce a two-dimensional electron gas in a region proximate an interface between the first layer and the second. A third layer that may be AlN, SiO2, GaN or AlGaN is formed on the third to be used as an etch stop layer. A fourth layer that may be a dielectric such as SiN is formed on the third layer. The methods further include forming a gate recess in the third and fourth layers that extends to the second layer, and then forming a gate contact in the gate recess. The gate contact may be a Schottky gate contact.

In additional embodiments of the present invention, forming a gate recess includes patterning a mask layer on the fourth layer of GaN based semiconductor material to have an opening corresponding to the gate recess and etching the fourth layer to the third layer using the patterned mask layer as an etch mask. Forming the gate recess further includes removing the third layer in the gate recess and thereby extending the gate recess to the second layer. This may include etching the fourth layer using the same patterned mask layer as the etch mask used for the fifth layer etch.

DETAILED DESCRIPTION OF EMBODIMENTS OF THE INVENTION

Figure 1A:
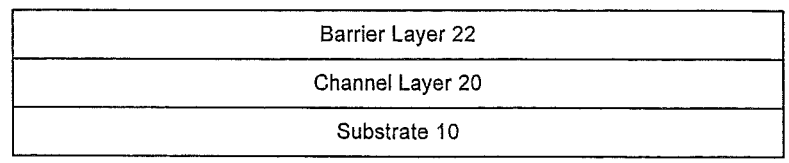
FIGS. 1A-1H are cross-sectional drawings illustrating fabrication of transistors according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present specification and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Some embodiments of the present invention utilize an etch stop layer that may prevent etch damage associated with the formation of a device gate recess in a semiconductor device. The etch stop layer, which may subsequently be removed from the gate recess, protects the underlying layer during recess formation. In some embodiments, portions of the remaining etch stop layer that are not in the gate recess provide passivation at the interface of the protected underlying layer.

Embodiments of the present invention may be particularly well suited for use in Group III-nitride based devices such as HEMTs, MESFETs, JFETs, MOSFETs, IGBTs, MISHFETs or other transistors with recessed gate contacts. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

Suitable structures for GaN-based HEMTs that may utilize embodiments of the present invention are described, for example, in commonly assigned U.S. Pat. No. 6,316,793 and U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. Patent Publication No. 2002/0167023A1 to Chavarkar et al., published Nov. 14, 2002, entitled "GROUP-III NITRIDE BASED HIGH ELECTRON MOBILITY TRANSISTOR (HEMT) WITH BARRIER/SPACER LAYER", U.S. Patent Publication No. 2004/0061129 filed Jul. 11, 2003 and published Apr. 1, 2004 for "NITRIDE-BASED TRANSISTORS AND METHODS OF FABRICATION THEREOF USING NON-ETCHED CONTACT RECESSES," and U.S. Patent Publication No. 2003/0020092 filed Jul. 23, 2002 and published Jan. 30, 2003 for "INSULATING GATE ALGAN/GAN HEMT", the disclosures of which are hereby incorporated herein by reference in their entirety.

Suitable structures for GaN-based MESFETs that may utilize embodiments of the present invention are described, for example, in commonly assigned U.S. Pat. No. 6,686,616 filed May 10, 2000, for "SILICON CARBIDE METAL-SEMICONDUCTOR FIELD EFFECT TRANSISTORS," and commonly assigned U.S. Pat. No. 5,270,554 filed Jun. 14, 1991, for "HIGH POWER HIGH FREQUENCY METAL-SEMICONDUCTOR FIELD-EFFECT TRANSISTOR FORMED IN SILICON CARBIDE," the disclosures of which are hereby incorporated herein by reference in their entirety.

Methods of fabrication according to some embodiments of the present invention are illustrated in FIGS. 1A-1H. As seen in FIG. 1A, a substrate 10 is provided on which nitride based devices may be formed. In particular embodiments of the present invention, the substrate 10 may be a semi-insulating silicon carbide (SiC) substrate that may be, for example, 4H polytype of silicon carbide. Other silicon carbide candidate polytypes include the 3C, 6H, and 15R polytypes. The term "semi-insulating" is used descriptively rather than in an absolute sense. In particular embodiments of the present invention, the silicon carbide bulk crystal has a resistivity equal to or higher than about $1 \times 10^5$ Ω-cm at room temperature.

Optional buffer, nucleation and/or transition layers (not shown) may be provided on the substrate 10. For example, an AlN buffer layer may be provided to provide an appropriate crystal structure transition between the silicon carbide substrate and the remainder of the device. Additionally, strain balancing transition layer(s) may also be provided as described, for example, in commonly assigned U.S. Patent Publication No. 2003/0102482A1, filed Jul. 19, 2002 and published Jun. 5, 2003, and entitled "STRAIN BALANCED NITRIDE HETROJUNCTION TRANSISTORS AND METHODS OF FABRICATING STRAIN BALANCED NITRIDE HETEROJUNCTION TRANSISTORS, the disclosure of which is incorporated herein by reference as if set forth fully herein.

Appropriate SiC substrates are manufactured by, for example, Cree, Inc., of Durham, N.C., the assignee of the present invention, and methods for producing are described, for example, in U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,292,501, the contents of which are also incorporated herein by reference in their entirety.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

Returning to FIG. 1A, a nitride-based channel layer 20 is provided on the substrate 10. The channel layer 20 may be deposited on the substrate 10 using buffer layers, transition layers, and/or nucleation layers as described above. The channel layer 20 may be under compressive strain. Furthermore, the channel layer and/or buffer nucleation and/or transition layers may be deposited by MOCVD or by other techniques known to those of skill in the art, such as MBE or HYPE.

In some embodiments of the present invention, the channel layer 20 is a Group III-nitride, such as $Al_xGa_{1-x}N$ where $0 \leq x < 1$, provided that the energy of the conduction band edge of the channel layer 20 is less than the energy of the conduction band edge of the barrier layer 22 at the interface between the channel and barrier layers. In certain embodiments of the present invention, x=0, indicating that the channel layer 20 is GaN. The channel layer 20 may also be other Group III-nitrides such as InGaN, AlInGaN or the like. The channel layer 20 may be undoped ("unintentionally doped") and may be grown to a thickness of greater than about 20 Å. The channel layer 20 may also be a multi-layer structure, such as a superlattice or combinations of GaN, AlGaN or the like.

A nitride-based barrier layer 22 is provided on the channel layer 20. The channel layer 20 may have a bandgap that is less than the bandgap of the barrier layer 22 and the channel layer 20 may also have a larger electron affinity than the barrier layer 22. The barrier layer 22 may be deposited on the channel layer 20. In certain embodiments of the present invention, the barrier layer 22 is AlN, AlInN, AlGaN or AlInGaN with a thickness of between about 0.1 nm and about 40 nm. In other embodiments of the present invention, the barrier layer 22 comprises multiple layers that may include GaN, AlN, and AlGaN. Examples of layers according to certain embodiments of the present invention are described in U.S. Patent Publication No. 2002/0167023A1, to Chavarkar et al., entitled "GROUP-III NITRIDE BASED HIGH ELECTRON MOBILITY TRANSISTOR (HEMT) WITH BARRIER/SPACER LAYER" the disclosure of which is incorporated herein by reference as if set forth fully herein. In particular embodiments of the present invention, the barrier layer 22 is thick enough and has a high enough Al composition and doping to induce a significant carrier concentration at the interface between the channel layer 20 and the barrier layer 22 through polarization effects. Also, the barrier layer 22 should be thick enough to reduce or minimize scattering of electrons in the channel due to ionized impurities or imperfections deposited at the interface between the barrier layer 22 and any additional overlying layers.

The barrier layer 22 may be a Group III-nitride and has a bandgap larger than that of the channel layer 20 and a smaller electron affinity than the channel layer 20. Accordingly, in certain embodiments of the present invention, the barrier layer 22 is AlGaN, AlInGaN and/or AlN or combinations of layers thereof. The barrier layer 22 may, for example, be from about 0.1 nm to about 40 nm thick, but is not so thick as to cause cracking or substantial defect formation therein. In certain embodiments of the present invention, the barrier layer 22 is undoped or doped with an n-type dopant to a concentration less than about $10^{19}$ cm$^{-3}$. In some embodiments of the present invention, the barrier layer 22 is $Al_xGa_{1-x}N$ where $0<x<1$. In particular embodiments, the aluminum concentration is about 25%. However, in other embodiments of the present invention, the barrier layer 22 comprises AlGaN with an aluminum concentration of between about 5% and about 100%. In specific embodiments of the present invention, the aluminum concentration is greater than about 10%.

Figure 1B:
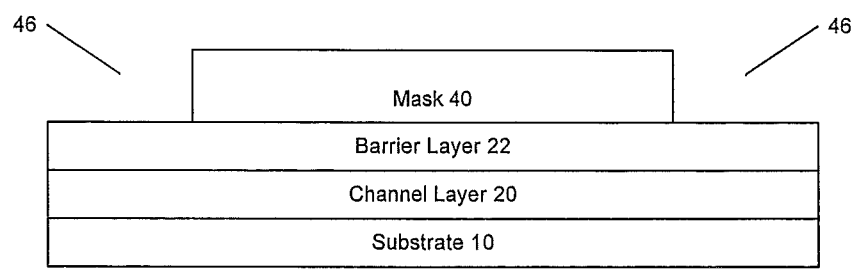
Figure 1C:
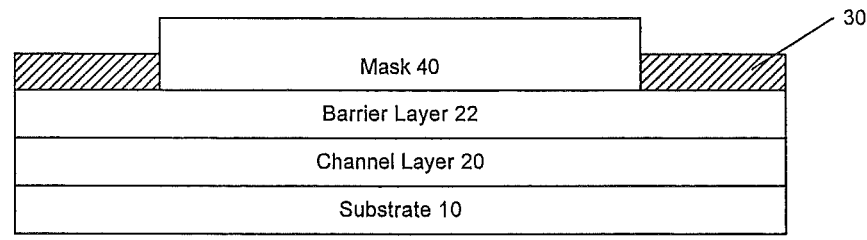

As illustrated in FIG. 1B, a mask layer 40 is patterned on the barrier layer to provide openings 46 for ohmic contacts. In some embodiments of the present invention, the mask layer may be a conventional photolithography mask material. In some embodiments of the present invention, the mask material may be SiN, SiO$_2$ or the like. As is further illustrated in FIG. 1C, for example, with a subsequent photolithography step and evaporation, ohmic metal is patterned to provide ohmic contact material patterns that when annealed provide the ohmic contacts 30.

Figure 1D:
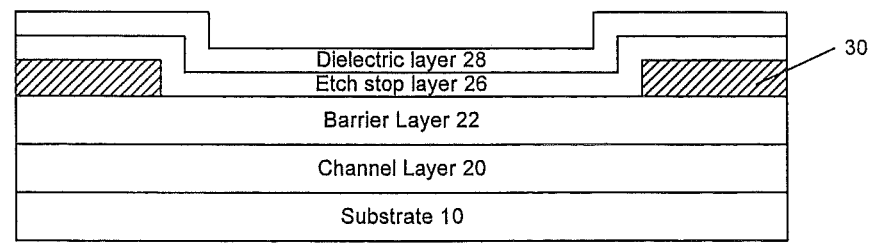

FIG. 1D illustrates the formation of the etch stop layer 26 and the dielectric layer 28. The etch stop layer 26 may be formed on the barrier layer 22 and ohmic contacts 30 and may be epitaxially grown and/or formed by deposition. The etch stop layer 26 may be sputtered AlN. In other embodiments, the etch stop layer 24 may be SiO2 formed by ex-situ plasma-enhanced chemical vapor deposition (PECVD) of SiO$_2$. Typically, the etch stop layer 26 may have a thickness of from about 50 A-300 A. The dielectric layer 28 may be formed on the etch stop layer 26 and may be formed by deposition. The dielectric layer 28 material may include SiN, SiO2, or SiON formed by ex-situ PECVD on top of etch stop layer 26. The dielectric layer 28 is different in composition than the etch stop layer 26. Typically, the dielectric layer 28 may have a thickness of from about 500 A-2000 A.

Figure 1E:
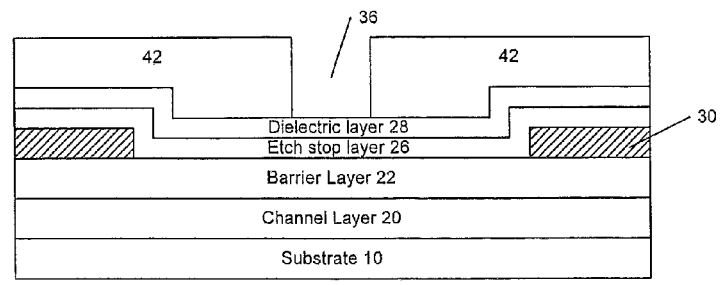
Figure 1F:
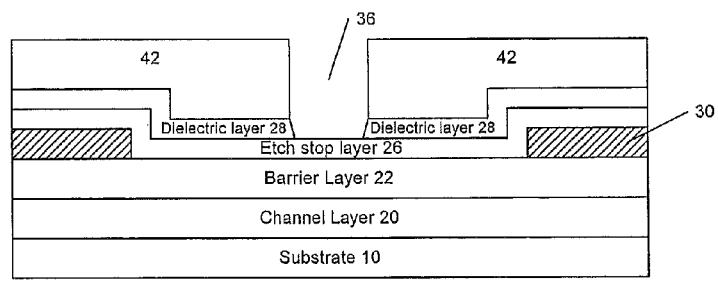
Figure 1G:
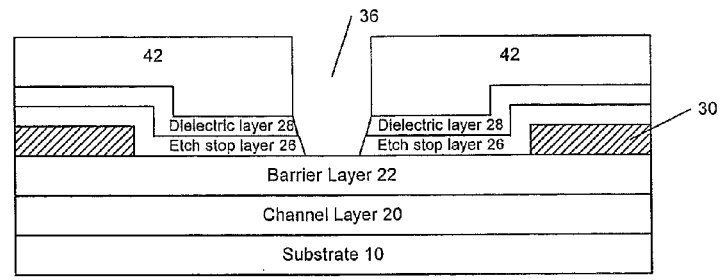

FIGS. 1E-1G illustrate the formation of a gate recess 36. In FIG. 1E, a second mask pattern 42 is formed on the dielectric layer 28 and patterned to form windows that expose a portion of the dielectric layer 28. In some embodiments of the present invention, the second mask pattern 42 may be a conventional photolithography mask material. In some embodiments of the present invention, the mask material may be silicon nitride, silicon dioxide or the like. As illustrated in FIG. 1F, exposed portions of the dielectric layer 28 including at least a portion in the gate recess 36 are removed such that the underlying etch stop layer 26 is exposed. The recess 36 may be formed utilizing a patterned mask and an etch process through the dielectric layer 28 to expose the underlying etch stop layer 26. The specific etch process is chosen such that the etch rate of the dielectric layer 28 is higher than the etch rate of the etch stop layer 26. In some embodiments of the present invention, the etch process may be a low damage etch. Examples of low damage etch methods for dielectric layer 28 materials such as SiN, SiO2, and SiON include etching techniques such as inductively coupled plasma using $SF_6$, $SF_6/O_2$, $CF_4$, $CF_4/O_2$ and/or other fluorinated species or electron cyclotron resonance (ECR) and/or downstream plasma etching with no or a small DC component to the plasma.

As illustrated in FIG. 1G, exposed portions of the etch stop layer 26 in the gate recess 36 are removed to expose a portion of the barrier layer 22 in the gate recess 36. Wet etching techniques may be used to remove the portions of etch stop layer 26. Wet etching techniques may be less damaging in that they typically comprise dissolving the layer in liquid chemicals. In contrast, dry etching techniques typically convert the layer to a gaseous compound with chemical or physical bombardment. In embodiments where the etch stop layer 26 is sputtered AlN, a hydroxide-based developer such as NH4OH may be used. In other embodiments where the etch stop layer 26 is SiO2, the wet etch may include BOE or BHF.

Suitable combinations of the dielectric layer 28, dry etch species, etch stop layer 26, and wet etch are summarized in Table 1 below.

TABLE 1

| Dielectric Layer 28 | Dry Etch Species | Etch Stop Layer 26 | Wet Etch of Etch Stop |
|---|---|---|---|
| SiN, SiO2, or SiON | SF6, SF6/O2, CF4 or CF4/O2 | AlN | Hydroxide-based developer, Dilute NH4OH |
| SiN or SiON | SF6, SF6/O2, CF4 or CF4/O2 | SiO2 | BOE, BHF |

In some embodiments of the present invention, the recess 36 is formed to extend into the barrier layer 22. The recess 36 may extend into the barrier layer 22 to, for example, adjust performance characteristics of the device such as threshold voltage, frequency performance, etc. The recess may be formed using the mask 42 and an etch process as described above. In particular embodiments where the ohmic contacts 30 provide source and drain contacts, the recess may be offset between the source and/or drain contacts such that the recess, and subsequently the gate contact 32, is closer to the source contact than the drain contact.

Figure 1H:
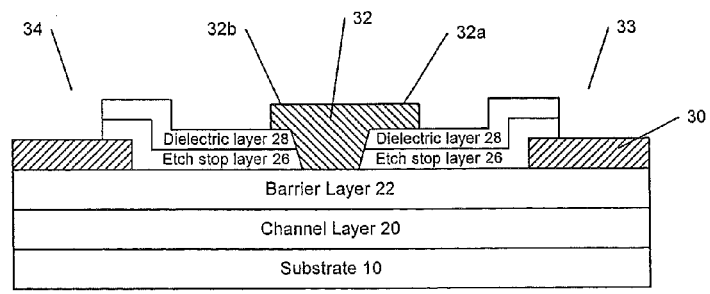

As seen in FIG. 1H, the gate contact 32 is formed in the recess and contacts the exposed portion of the barrier layer 22. The gate contact may be a "T" gate and may be fabricated using conventional fabrication techniques. The gate contact may include a field plate extension 32a over a portion of the dielectric layer 28 on the drain side 33 of the gate contact 32. A portion of the gate contact 32b may overlap the dielectric layer 28 on the source side 34 to potentially allow higher class operation, as described in U.S. patent application Ser. No. 11/078,265 filed Mar. 3, 2005 and entitled "WIDE BAND-GAP TRANSISTORS WITH GATE-SOURCE FIELD PLATES," the disclosure of which is incorporated herein by reference as if set forth fully herein. Suitable gate materials may depend on the composition of the barrier layer 22, however, in certain embodiments, conventional materials capable of making a Schottky contact to a nitride based semiconductor material may be used, such as Ni, Pt, $NiSi_x$, Cu, Pd, Cr, W and/or WSiN. It is possible that a small gap between the gate contact 32 and one or both of the etch stop layer 26 or dielectric layer 28 may arise as a result of, for example, anisotropy of the gate recess etch, resulting in an exposed surface of the barrier layer 22 between the gate contact 32 and one or both of the etch stop layer 26 or dielectric layer 38. This gap may be formed intentionally.

As also seen in FIG. 1H, portions of the etch stop layer 26 and the dielectric layer 28 that were formed on the ohmic contacts 30 are removed to provide access to the ohmic contacts 30. This may occur at any time during or after the formation of the gate recess. The interface between the etch stop layer 26 and barrier layer 22 may have a low surface-state density and provide a high barrier to prevent injection of electrons from the barrier layer 22 to the etch stop layer 26. In other words, the etch stop layer 26 may provide good passivation.

A passivation layer may also be provided on the structure of FIG. 1H. The passivation layer may be blanket deposited on the structure of FIG. 1H. In certain embodiments of the present invention, the passivation layer may be silicon nitride, aluminum nitride, silicon dioxide, an ONO structure and/or an oxynitride. Furthermore, the passivation layer may be a single or multiple layers of uniform and/or non-uniform composition.

Figure 2:
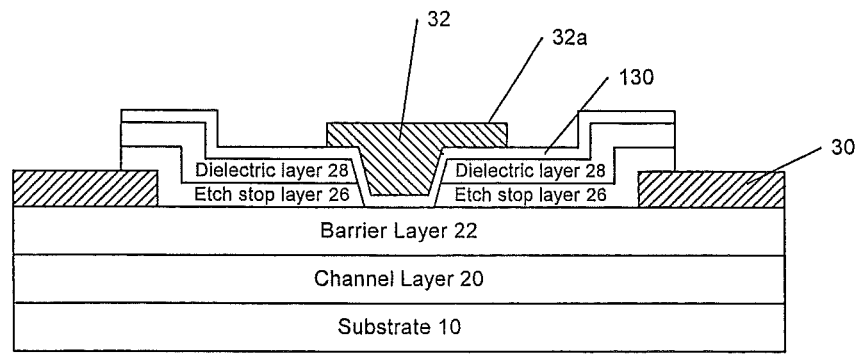
FIG. 2 is a cross-sectional drawing illustrating fabrication of transistors according to further embodiments of the present invention.

FIG. 2 illustrates formation of transistors according to further embodiments of the present invention. As seen in FIG. 2, the structure of FIG. 1H may have an insulating layer 130 formed on the structure including in the gate recess. The gate contact 32 may then be formed on the insulating layer 130. The insulating layer 130 may be one or more layers and may include, for example, SiN, AlN, $SiO_2$, and/or an ONO structure. Thus, in some embodiments of the present invention, an insulating gate HEMT may be provided, for example, as described in U.S. Patent Publication No. 2003/0020092 entitled "INSULATING GATE ALGAN/GAN HEMT", to Parikh et al., the disclosure of which is incorporated herein by reference as if set forth fully herein.

Figure 3:
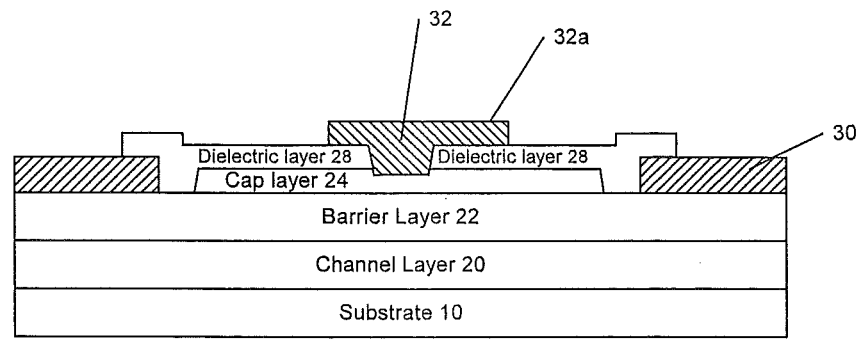
FIG. 3 is a cross-sectional drawing illustrating fabrication of transistors according to further embodiments of the present invention.

FIG. 3 illustrates formation of transistors according to further embodiments of the present invention. As seen in FIG. 3, the structure may have a cap layer 24 formed on the barrier layer that protects the barrier layer 22 from dry etching. Gate contact 32 formation may then comprise dry etching the dielectric layer 28 to the cap layer 24 and then removing the portion of the cap layer 24 damaged by the dry etch. The gate contact 32 may be formed on the cap layer 24. In other embodiments, a portion of the cap layer 24 is removed to expose the barrier layer 22 and the gate contact 32 may be formed directly on the barrier layer 22. The dry etching of the dielectric layer 28 and wet etching of the cap layer 24 may be performed according to previously discussed embodiments.

The cap layer 24, different in composition than the barrier layer 22, may be a Group III-nitride, and, in some embodiments, a GaN based semiconductor material, such as GaN, AlGaN and/or InGaN. In particular embodiments of the present invention, the cap layer is GaN. In other embodiments where both the cap layer 24 and the barrier layer 22 are AlGaN, the cap layer 24 has a lower mole fraction of Al. In embodiments where the cap layer 24 is GaN, AlGaN, or InGaN, the wet etching may be a heated hydroxide-based solution and/or photo-enhanced electrochemical wet etching. Furthermore, the cap layer 24 may be a single layer or multiple layers of uniform and/or non-uniform composition and/or thickness. In some embodiments of the present invention, the cap layer 24 may be a graded AlGaN layer and a GaN layer as described in Shen et al., "High-Power Polarization-Engineered GaN/AlGaN/GaN HEMTs Without Surface Passivation," IEEE Electron Device Letters, Vol. 25, No. 1, pp. 7-9, January 2004, the disclosure of which is incorporated herein by reference as if set forth in its entirety. For example, in some embodiments of the present invention, the cap layer 24 may be a GaN layer with a SiN layer on the GaN layer. The cap layer 24 moves the top surface of the device physically away from the channel, which may reduce the effect of the surface on the operation of the device.

The cap layer 24 may be blanket formed on the barrier layer 22 and may be epitaxially grown and/or formed by deposition. For example, the cap layer may be formed by in-situ growth of SiN on a GaN cap layer or ex-situ PECVD of SiN or $SiO_2$ on top of the GaN cap layer. Typically, the cap layer 24 may have a thickness of from about 2 nm to about 500 nm. For example, a cap layer 24 of SiN and GaN may have a thickness of about 300 nm. In other embodiments, the cap layer 24 may be SiN formed by in-situ growth on the barrier layer 22. Examples of cap layers according to some embodiments of the present invention are described in U.S. Patent Publication No. 2002/0167023A1, to Chavarkar et al., entitled "GROUP-III NITRIDE BASED HIGH ELECTRON MOBILITY TRANSISTOR (HEMT) WITH BARRIER/SPACER LAYER."

Figure 4:
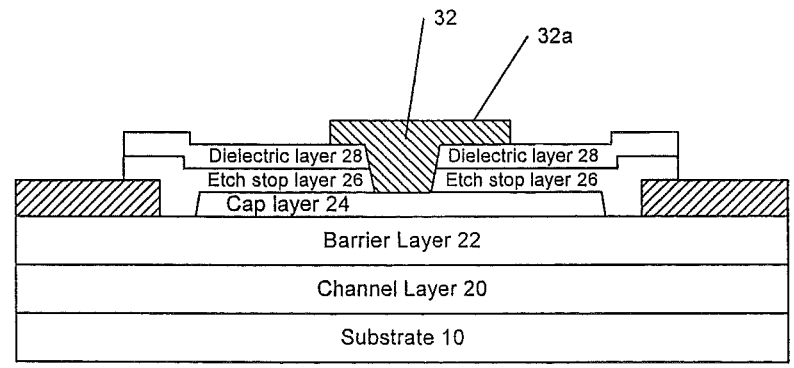
FIG. 4 is a cross-sectional drawing illustrating fabrication of transistors according to still further embodiments of the present invention.

FIG. 4 illustrates formation of transistors according to further embodiments of the present invention. As seen in FIG. 4, the structure may have a cap layer 24 formed on the barrier layer 22, an etch stop layer 26 formed on the cap layer 24, and a dielectric layer 28 formed on the etch stop layer 26. Gate contact 32 formation may then comprise dry etching the dielectric layer 28 to the etch stop layer 26 and then removing a portion of the etch stop layer 26 to expose the cap layer 24. The etch stop layer 26 thereby protects the cap layer 24 from dry etching. The gate contact 32 may be formed on the cap layer 24. The dry etching of the dielectric layer 28 and wet etching of the etch stop layer 26 may be performed according to previously discussed embodiments. The cap layer 24 may be SiN formed by in-situ growth.

In some embodiments of the present invention utilizing SiN and/or $SiO_2$ in the cap layer 24, etch stop layer 22, and/or dielectric layer 28, the ohmic contacts 30 are spaced apart from the layers with SiN and/or $SiO_2$ portions a distance sufficiently large to allow for misalignment tolerances in the formation and patterning of the ohmic contact metal. If the ohmic contact metal contacts the SiN and/or $SiO_2$ layers, the metal may diffuse into the SiN and/or $SiO_2$ layers during subsequent heating steps that may result in a short between a gate contact and the ohmic contact(s) 30.

HEMT devices according to some embodiments of the present invention were subjected to high temperature, reverse bias (HTRB) testing similar to those described in U.S. patent application Ser. No. 11/080,905, filed Mar. 15, 2005 and entitled "GROUP III NITRIDE FIELD EFFECT TRANSISTORS (FETs) CAPABLE OF WITHSTANDING HIGH TEMPERATURE REVERSE BIAS TEST CONDITIONS," the disclosure of which is incorporated herein by reference as if set forth fully herein. The HEMT device for testing contained a buffer layer of AlN nucleation followed by about 6 μm of GaN, the last 100 Å or so of GaN being the channel layer, a barrier layer of about 0.6 nm AlN and about 27 nm AlGaN, an etch stop layer of sputtered AlN, and a dielectric layer of about 110 nm SiN. The gate contact was formed to the barrier layer as previously described.

HRTB tests were run on two different wafer lots of two-finger, 0.5 mm-periphery devices. For a HEMT having a pinch off voltage of from about −3.0 to about −4.0 volts, a dc drain bias of about 28.0 volts and a corresponding maximum drain swing to as much as 56 volts was predicted. The gate voltage may swing from about 2.0 to about 3.V to from about −8 to about −10 volts. Thus, tests were performed using a drain-to-source voltage ($V_{DS}$) of 56 volts, a gate to source voltage ($V_{gs}$) of −8 volts at a normal operating temperature of 140° C. for eight hours. The results are listed in the Table 2 below. The data represents median data of 5 or more devices on each of wafer A and wafer B. P1 represents $P_{out}$ @1 dB compression point, P3 represents $P_{out}$ @3 dB compression point, $I_{init}$ represents gate leakage before HTRB testing, and $I_{end}$ represents gate leakage after HTRB testing. The final column of Table 2 indicates the resulting change (Delta) in P3 output power after HTRB stress.

TABLE 2

| Wafer | P1 @ 28 V Units = dBm | P3 @ 28 V Units = dBm | $I_{init}$ @25 C. Units = A | $I_{end}$ @25 C. Units = A | Delta HTRB P3 @28 V Units = dB |
|---|---|---|---|---|---|
| A | 28.89 | 32.90 | −1.51e−05 | −7.48e−06 | −0.332 |
| B | 28.18 | 31.45 | −1.69e−05 | −1.25e−05 | 0.150 |

The results in Table 2 indicate that embodiments of the present invention may not fail catastrophically during HTRB stress, because the resulting change in power after HTRB stress can be satisfactorily small to one skilled in the art. In particular, as shown in the last column of Table 2, less than about 1 dB of power change may be obtained after HTRB stress, according to some embodiments of the present invention. In other embodiments, less than about 0.3 dB of power change may be obtained after HTRB stress. It will understood that, for wafer B, the results of 0.150 would appear to indicate a lack of any measurable power loss after HTRB stress, but would not appear to indicate an actual increase.

While embodiments of the present invention have been described with reference to a particular sequence of operations, some modification in the sequence may be made or other operations may be included while still benefiting from the teachings of the present invention. Operations described above as being provided in a single step may be provided in multiple steps and, likewise, operations described as multiple steps could be combined into a single step.

While embodiments of the present invention have been described herein with reference to particular HEMT structures, the present invention should not be construed as limited to such structures. For example, additional layers may be included in the HEMT device while still benefiting from the teachings of the present invention. Such additional layers may include GaN cap layers, as for example, described in Yu et al., "Schottky barrier engineering in III-V nitrides via the piezoelectric effect," Applied Physics Letters, Vol. 73, No. 13, 1998, or in U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," the disclosures of which are incorporated herein by reference as if set forth fully herein. In some embodiments, insulating layers such as SiN, an ONO structure or relatively high quality AlN may be deposited for making a MISHEMT and/or passivating the surface. The additional layers may also include a compositionally graded transition layer or layers.

Furthermore, the barrier layer 22 may also be provided with multiple layers as described in U.S. Patent Publication No. 2002/0167023A1, to Chavarkar et al., entitled "GROUP-III NITRIDE BASED HIGH ELECTRON MOBILITY TRANSISTOR (HEMT) WITH BARRIER/SPACER LAYER" the disclosure of which is incorporated herein by reference as if set forth fully herein. Thus, embodiments of the present invention should not be construed as limiting the barrier layer to a single layer but may include, for example, barrier layers having combinations of GaN, AlGaN and/or AlN layers. For example, a GaN, AlN structure may be utilized to reduce or prevent alloy scattering. Thus, embodiments of the present invention may include nitride based barrier layers, such nitride based barrier layers may include AlGaN based barrier layers, AlN based barrier layers and combinations thereof.

In the drawings and specification, there have been disclosed typical embodiments of the invention, and, although specific terms have been employed, they have been used in a generic and descriptive sense only and not for purposes of limitation.

That which is claimed is:

1. A method of fabricating a III-nitride based transistor comprising:
   forming a nitride-based layer on a substrate;
   forming a cap layer on the nitride-based layer, wherein the cap layer is different from the nitride-based layer;
   forming an etch stop layer on the cap layer, wherein the etch stop layer is different from the cap layer;
   forming a dielectric layer on the etch stop layer, wherein the dielectric layer is different than the etch stop layer;
   selectively etching the dielectric layer to the etch stop layer to form a gate recess that extends through the dielectric layer to the etch stop layer;
   after selectively etching the dielectric layer to the etch stop layer, selectively etching the etch stop layer in the gate recess to, or into but not through, the cap layer; and
   forming a gate contact in the gate recess,
   wherein the cap layer comprises a dielectric.

2. The method of claim 1 wherein forming the cap layer is performed by in-situ growth of SiN.

3. The method of claim 1 wherein the gate contact extends on the dielectric layer towards the spaced apart contacts for different distances.

4. The method of claim 1 wherein the etch stop layer comprises AlN, GaN, AlGaN and/or $SiO_2$.

5. The method of claim 1 wherein the substrate comprises silicon carbide or sapphire.

6. The method of claim 1 wherein the nitride-based layer comprises MN, AlInN, AlGaN and/or AlInGaN.

7. The method of claim 1 wherein the dielectric layer comprises SiN and/or SiON.

* * * * *